United States Patent
Shinogi et al.

(10) Patent No.: US 8,148,811 B2
(45) Date of Patent: Apr. 3, 2012

(54) SEMICONDUCTOR DEVICE AND MANUFACTURING METHOD THEREOF

(75) Inventors: Hiroyuki Shinogi, Gifu (JP); Katsuhiko Kitagawa, Ota (JP); Kazuo Okada, Ota (JP); Hiroshi Yamada, Ebina (JP)

(73) Assignees: Semiconductor Components Industries, LLC, Phoenix, AZ (US); SANYO Semiconductor Co., Ltd., Gunma (JP)

( * ) Notice: Subject to any disclaimer, the term of this patent is extended or adjusted under 35 U.S.C. 154(b) by 150 days.

(21) Appl. No.: 12/438,888

(22) PCT Filed: Aug. 22, 2007

(86) PCT No.: PCT/JP2007/066703
§ 371 (c)(1),
(2), (4) Date: Feb. 25, 2009

(87) PCT Pub. No.: WO2008/023826
PCT Pub. Date: Feb. 28, 2008

(65) Prior Publication Data
US 2009/0321903 A1    Dec. 31, 2009

(30) Foreign Application Priority Data
Aug. 25, 2006    (JP) .................... 2006-229014

(51) Int. Cl.
*H01L 23/12*    (2006.01)
*H01L 31/0232*    (2006.01)

(52) U.S. Cl. ........ 257/704; 257/432; 257/434; 257/680; 257/81; 257/E23.181

(58) Field of Classification Search .................. 257/704, 257/81, 432, E23.181, 424, 680
See application file for complete search history.

(56) References Cited

U.S. PATENT DOCUMENTS
6,117,705 A    9/2000    Glenn et al.
(Continued)

FOREIGN PATENT DOCUMENTS
JP    62-149155    7/1987
(Continued)

OTHER PUBLICATIONS
Okada, K. et al., U.S. Office Action mailed Dec. 14, 2010, directed to U.S. Appl. No. 12/438,879; 6 pages.
(Continued)

*Primary Examiner* — Nitin Parekh
(74) *Attorney, Agent, or Firm* — Morrison & Foerster LLP (57) ABSTRACT

This invention is directed to offer a semiconductor device in which a cavity space is easily provided in a specific region when a supporting member is bonded to a semiconductor substrate through an adhesive layer, and its manufacturing method. A resist layer is applied to an entire top surface of the semiconductor substrate 2, and exposure to transfer a pattern is performed. By subsequent development and selective removal of the resist layer, the resist layer is formed into a shape of a plurality of columnar structures 4. Then, an adhesive material made of an epoxy resin or the like is applied to the entire top surface of the semiconductor substrate 2. The adhesive material is gathered around the columnar structures 4 by itself to form an adhesive layer 5. Therefore, in contrast, the adhesive layer 5 does not deposit in a region where the cavity is to be formed. Then, the supporting member 6 is bonded through the columnar structures 4 and the adhesive layer 5. By bonding the supporting member 6, there is formed the cavity 7 surrounded with the semiconductor substrate 2, the columnar structures 3 and the supporting member 6.

7 Claims, 6 Drawing Sheets

U.S. PATENT DOCUMENTS

| | | | |
|---|---|---|---|
| 6,268,231 B1 | 7/2001 | Wetzel | |
| 6,268,654 B1 * | 7/2001 | Glenn et al. | 257/704 |
| 6,319,745 B1 | 11/2001 | Bertin et al. | |
| 6,351,389 B1 * | 2/2002 | Malladi | 361/760 |
| 6,566,745 B1 * | 5/2003 | Beyne et al. | 257/680 |
| 6,596,117 B2 * | 7/2003 | Hays et al. | 156/251 |
| 6,630,661 B1 | 10/2003 | Hoffman | |
| 6,727,643 B2 | 4/2004 | Suehiro | |
| 6,759,266 B1 | 7/2004 | Hoffman | |
| 6,885,107 B2 * | 4/2005 | Kinsman | 257/778 |
| 7,026,758 B2 | 4/2006 | Guenther et al. | |
| 7,087,464 B2 | 8/2006 | Yu et al. | |
| 7,154,173 B2 | 12/2006 | Ikeda et al. | |
| 7,160,478 B2 | 1/2007 | Leib et al. | |
| 7,282,806 B2 * | 10/2007 | Hembree et al. | 257/787 |
| 7,564,496 B2 | 7/2009 | Wolterink et al. | |
| 7,576,427 B2 * | 8/2009 | Potter | 257/710 |
| 7,638,813 B2 * | 12/2009 | Kinsman | 257/99 |
| 2003/0183921 A1 * | 10/2003 | Komobuchi et al. | 257/704 |
| 2004/0169466 A1 | 9/2004 | Suehiro et al. | |
| 2004/0217703 A1 * | 11/2004 | Wittmann et al. | 313/512 |
| 2005/0012169 A1 | 1/2005 | Ikeda et al. | |
| 2005/0156260 A1 | 7/2005 | Partridge et al. | |
| 2006/0006511 A1 | 1/2006 | Roh et al. | |
| 2006/0214975 A1 | 9/2006 | Eguchi et al. | |
| 2007/0075417 A1 * | 4/2007 | Hwang et al. | 257/704 |
| 2008/0277672 A1 | 11/2008 | Hovey et al. | |
| 2009/0008682 A1 | 1/2009 | Kusunoki et al. | |
| 2009/0206349 A1 | 8/2009 | Yamada et al. | |
| 2010/0065929 A1 | 3/2010 | Okada et al. | |

FOREIGN PATENT DOCUMENTS

| | | |
|---|---|---|
| JP | 08-078560 | 3/1996 |
| JP | 09-061239 | 3/1997 |
| JP | 11-351959 | 12/1999 |
| JP | 2000-299396 A | 10/2000 |
| JP | 2001-298102 A | 10/2001 |
| JP | 2003-078121 A | 3/2003 |
| JP | 2005-019966 A | 1/2005 |
| JP | 2005-072554 A | 3/2005 |
| JP | 2005-209790 A | 8/2005 |
| JP | 2006-032940 A | 2/2006 |
| JP | 2006-100735 A | 4/2006 |
| WO | WO-2006/040986 | 4/2006 |

OTHER PUBLICATIONS

Yamada, H. et al., U.S. Office Action mailed Jan. 7, 2011, directed to U.S. Appl. No. 12/438,869; 10 pages.

International Search Report mailed on Nov. 20, 2007, directed to counterpart International Patent Application No. PCT/JP2007/066703; 4 pages.

Yamada et al., U.S. Office Action mailed Jul. 11, 2011, directed to related U.S. Appl. No. 12/438,869; 9 pages.

Okada, K. et al., U.S. Office Action mailed May 9, 2011, directed to U.S. Appl. No. 12/438,879; 11 pages.

Yamada, H. et al., U.S. Office Action mailed Jan. 18, 2012, directed to U.S. Appl. No. 12/438,869; 9 pages.

Okada et al., U.S. Office Action mailed Nov. 30, 2011, directed to U.S. Appl. No. 12/438,879; 6 pages.

* cited by examiner

SEMICONDUCTOR DEVICE AND MANUFACTURING METHOD THEREOF

REFERENCE TO RELATED APPLICATIONS

This application is a national stage application under 35 USC 371 of International Application No. PCT/JP2007/066703, filed Aug. 22, 2007, which claims priority from Japanese Patent Application No. 2006-229014, filed Aug. 25, 2006, the contents of which are incorporated herein by reference.

FIELD OF THE INVENTION

This invention relates to a semiconductor device and its manufacturing method, specifically to a semiconductor device in which a supporting member is bonding through an adhesive layer and its manufacturing method.

DESCRIPTION OF THE RELATED ART

Figure 10:
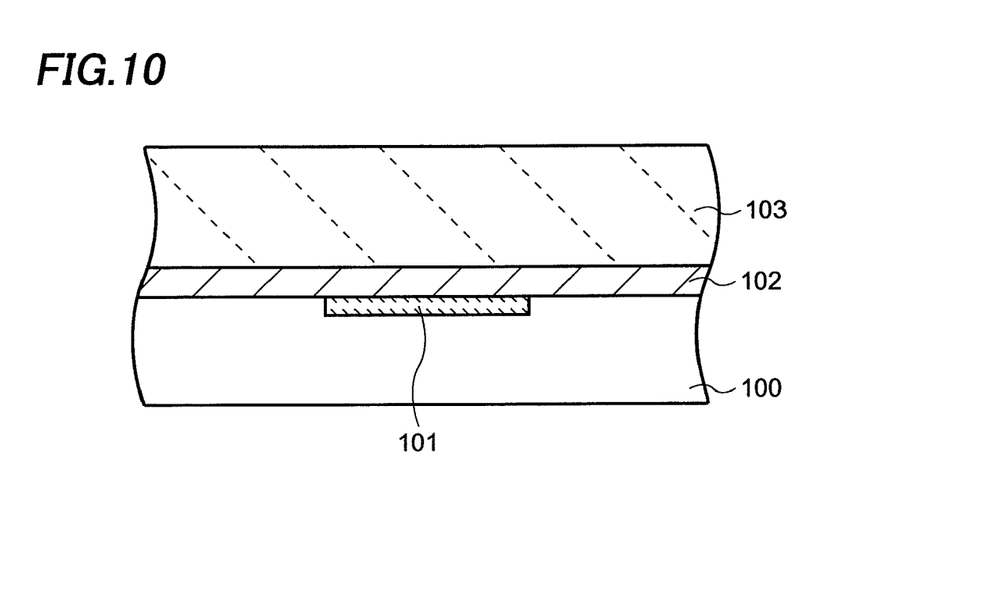
FIG. 10 is a cross-sectional view showing a conventional semiconductor device.
Figure 11:
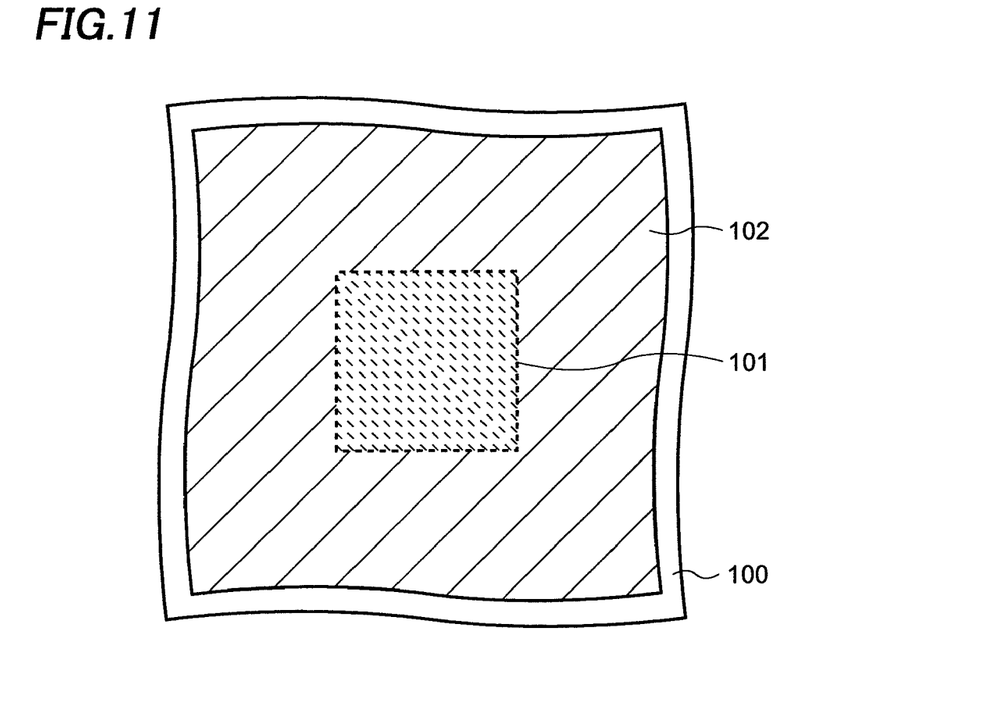
FIG. 11 is a plan view showing the conventional semiconductor device.

It has been practiced that a supporting member (a glass substrate, for example) is bonded onto a semiconductor substrate through an adhesive layer in order to bolster the semiconductor substrate which is ever being reduced in thickness and to protect a surface of a device component. FIG. 10 is a cross-sectional view showing a conventional semiconductor device, and FIG. 11 is its plan view. Note that a supporting member 103 is omitted in FIG. 11.

A device component 101 (a CCD, an infrared sensor, a light-receiving component such as a CMOS sensor or a light-emitting component, for example) is formed on a top surface of a semiconductor substrate 100 made of silicon (Si) or the like. An adhesive layer 102, which is made of epoxy resin, polyimide or the like, is uniformly formed on the top surface of the semiconductor substrate 100, as shown in FIG. 10. And the supporting member 103 is bonded to the semiconductor substrate 100 through the adhesive layer 102.

Technologies related to this invention are disclosed in Japanese Patent Publication No. 2005-072554, for example.

When the adhesive layer is interposed between the device component and the supporting member, there has been a problem that a quality of the semiconductor device is degraded. In the case where the device component is a light-receiving component or a light-emitting component, for example, there has been a problem that an operational quality of the semiconductor device is degraded when even a small amount of unnecessary material obstructing incident light to the device component (or light emitted from the device component) is interposed between the device component and the supporting member. An example of the problem is that a desired refractive index is not obtained. Also, there is a problem that the adhesive layer is deteriorated by light of a specific wavelength such as Blu-ray, and the deteriorated adhesive layer degrades the operational quality of the semiconductor device. In order to solve the problems described above, a cavity is required to be provided between the semiconductor substrate (especially in a region where the device component is formed) and the supporting member in some cases. The cavity means an internal space between the semiconductor substrate and the supporting member.

However, the adhesive layer usually has fluidity, and the device component is fine-structured. Therefore, it has been difficult to control a location to form the adhesive layer so as to provide the cavity only in a specific region.

SUMMARY OF THE INVENTION

This invention is directed to offering a semiconductor device in which the cavity is easily provided in the specific region when the supporting member is bonded to the semiconductor substrate through the adhesive layer, and its manufacturing method.

This invention is directed to solve the problems addressed above and has following features. This invention offers a semiconductor device provided with a semiconductor substrate, a plurality of columnar structures formed on the semiconductor substrate and surrounding a region of the semiconductor substrate where a cavity is to be formed, and a supporting member bonded onto a top surface of the semiconductor substrate through an adhesive layer and the columnar structures, wherein a device component is sealed in the cavity surrounded by the semiconductor substrate, the columnar structures and the supporting member.

This invention also offers a manufacturing method of a semiconductor device including a process step to form on a top surface of a semiconductor substrate a plurality of columnar structures surrounding a region where a cavity is to be formed, a process step to apply an adhesive material to the top surface of the semiconductor substrate to form an adhesive layer, and a process step to bond a supporting member onto the top surface of the semiconductor substrate through the adhesive layer and the columnar structures to seal a device component in the cavity surrounded by the semiconductor substrate, the columnar structures and the supporting member.

According to this invention, the plurality of columnar structures is formed to surround the region on the semiconductor substrate where the cavity is to be formed. With a composition described above, the material to form the adhesive layer tends to gather around the columnar structures. In contrast, the adhesive layer does not deposit in the region where the cavity is to be formed, and the cavity can be formed easily as a result.

DETAILED DESCRIPTION OF THE INVENTION

Next, a semiconductor device and its manufacturing method according to a first embodiment of this invention will be explained referring to the drawings. FIGS. 1 through 5 are cross-sectional views and plan views presented in the order of manufacturing process steps.

Figure 1:
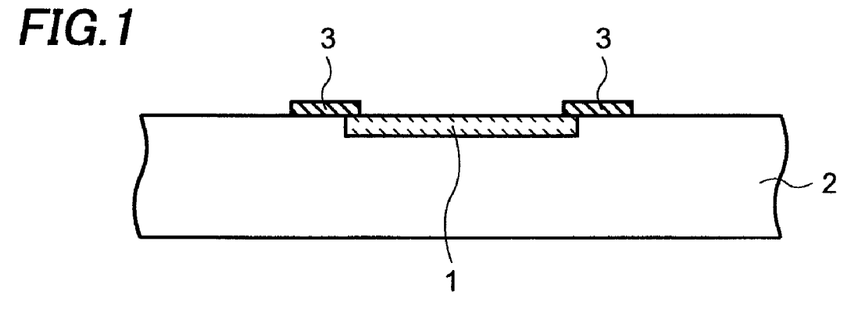
FIG. 1 is a cross-sectional view showing a semiconductor device and its manufacturing method according to a first embodiment of this invention.

First, as shown in FIG. 1, there is provided a semiconductor substrate 2, made of silicon (Si) or the like, on a top surface of which a device component 1 (a CCD, a light-receiving component such as an infrared sensor or a CMOS sensor, a light-emitting component or other semiconductor component, for example) is formed. The device component 1 may be a mechanical device such as a MEMS (Micro Electro Mechanical Systems) component. The MEMS means a device in which a mechanical component, a sensor, an actuator, an electronic circuit and the like are integrated on a semiconductor substrate.

Next, an insulation film (a silicon oxide film formed by a thermal oxidation method, a CVD method or the like, for example), that is not shown in the drawing, is formed on the top surface of the semiconductor substrate 2. Then, a wiring layer 3 (an aluminum layer, for example) is formed on the insulation film by a sputtering method, for example. The wiring layer 3 is electrically connected with the device component 1 and a conductive terminal, that is to be described, and serves to provide the device component 1 with a power supply.

Figure 2:
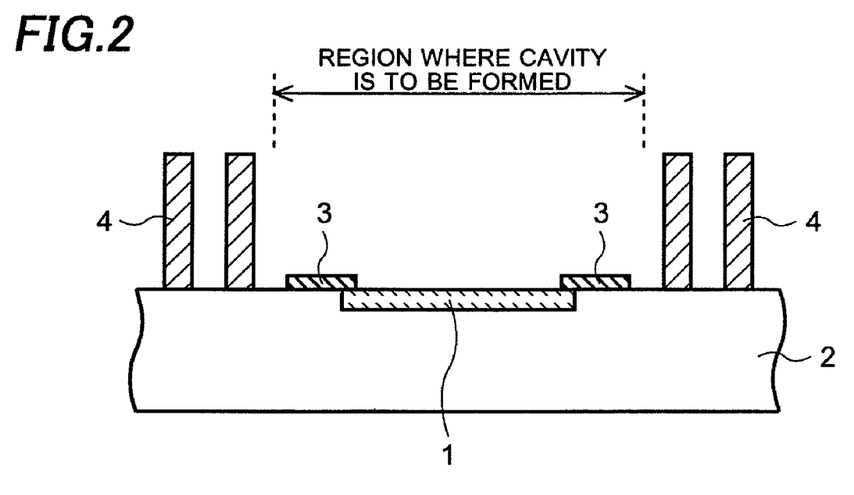
FIG. 2 is a cross-sectional view showing the semiconductor device and its manufacturing method according to the first embodiment of this invention.
Figure 3A:
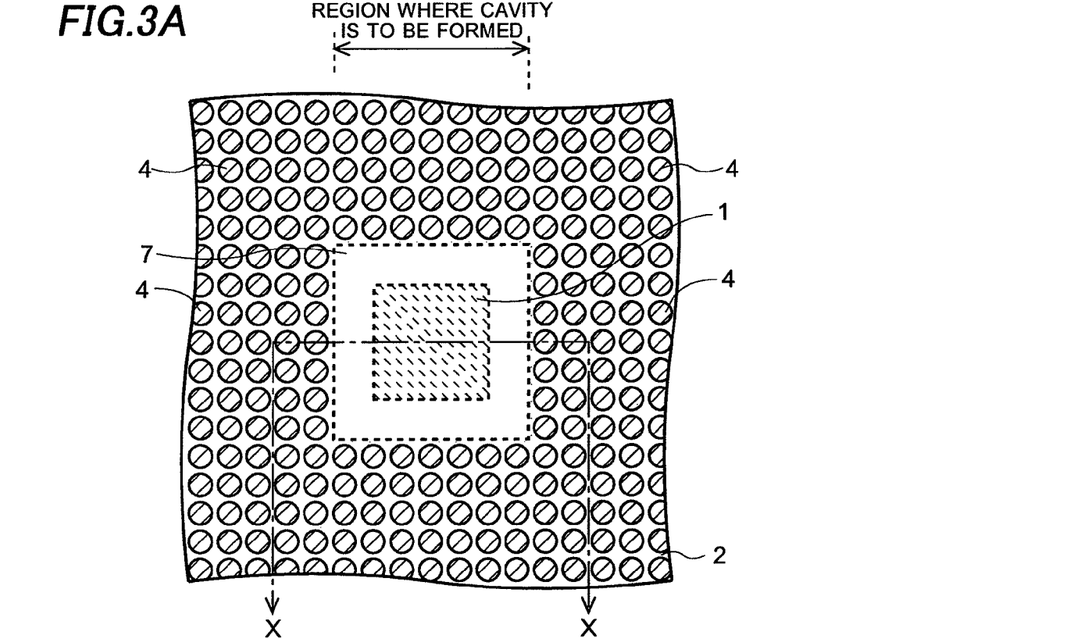
FIGS. 3A and 3B are plan views showing the semiconductor device and its manufacturing method according to the first embodiment of this invention.
Figure 3B:
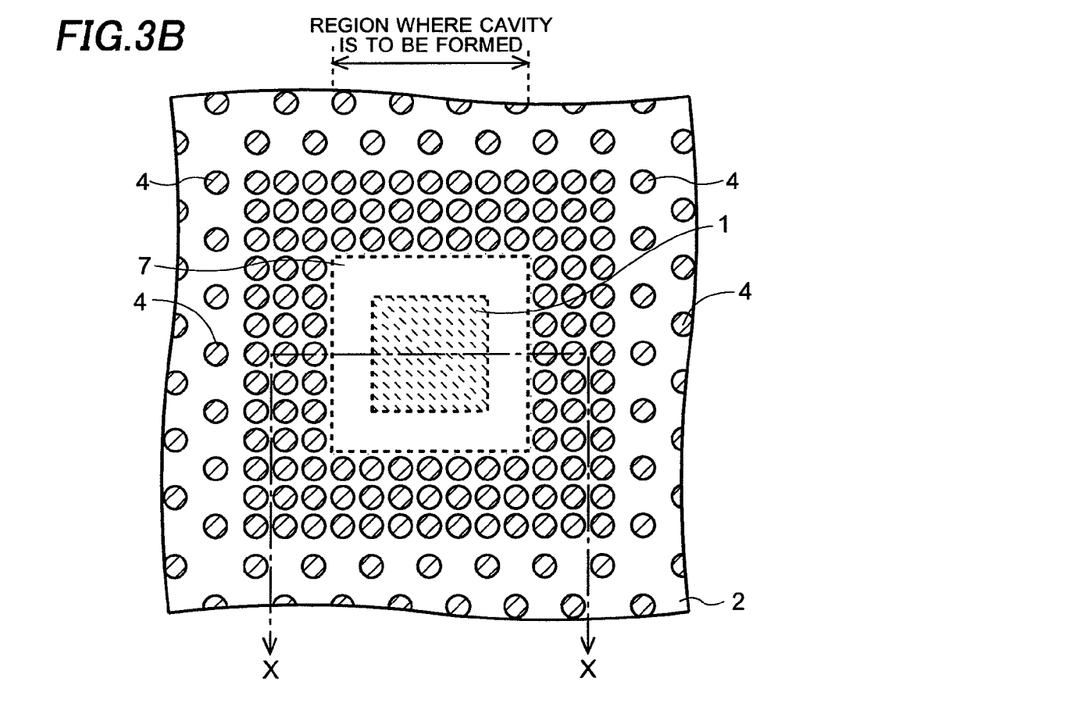

Next, as shown in FIGS. 2, 3A and 3B, a plurality of columnar structures 4 that surround a region where a cavity is to be formed is formed on the top surface of the semiconductor substrate 2. FIG. 2 is a cross-sectional view showing a section X-X in FIGS. 3A and 3B.

To describe concretely, the entire top surface of the semiconductor substrate 2 is coated with a resist layer, and an exposure to transfer a pattern of the columnar structures 4 to the resist layer is performed. By subsequent development and selective removal of the resist layer, the resist layer is formed into a shape of the plurality of columnar structures 4. An organic film of polyimide, acryl resin or the like may be used as a material to form the columnar structures 4 other than the resist layer. Although the columnar structures 4 are cylindrical columns of 20 μm in diameter and 50 μm in height in this embodiment as shown in FIGS. 3A and 3B, they may be rectangular columns as well. The columnar structures 4 are placed from each other at a distance (10 μm, for example) that is good enough to induce a capillary phenomenon. It is not necessary that they are arrayed at regular intervals.

Although the columnar structures 4 shown in FIG. 3A are placed at regular intervals and at approximately uniform density all over locations surrounding the region where the cavity is to be formed, the density may be varied as well. That is, the columnar structures 4 may be placed densely at locations close to the region where the cavity is to be formed, while the columnar structures 4 are placed sparsely at locations distant from the region where the cavity is to be formed, as shown in FIG. 3B. To be placed sparsely means that the columnar structures 4 are separated by a distance of 50 μm to 100 μm from each other, for example. By placing the columnar structures 4 as shown in FIG. 3B, it is considered that the adhesive material is gathered at the locations distant from the region where the cavity is to be formed so that the cavity is formed favorably.

The columnar structures 4 may be made of an insulation film such as a silicon oxide film or a silicon nitride film. In that case, the insulation film can be formed by a CVD method, for example, and then the columnar structures 4 can be formed by dry-etching using a photoresist layer (not shown) as a mask.

Next, the entire top surface of the semiconductor substrate 2 is coated with an adhesive material such as epoxy resin, polyimide (photosensitive polyimide, for example), resist or acryl to form an adhesive layer 5. The coating method is preferably spin coating. The applied adhesive material is gathered around the columnar structures 4 by itself. That is considered to be the same phenomenon as the capillary phenomenon. That is, surface tension applies a contractive force to the adhesive layer 5 that has the fluidity. As a result, the adhesive layer 5 is gathered together in the narrow space between the columnar structures 4, and in contrast, the adhesive layer 5 does not deposit in the region where the cavity is to be formed. The region where the cavity is to be formed in this embodiment is a specific region on the semiconductor substrate including at least a region where the device component 1 is formed. The adhesive material for the adhesive layer 5 is preferably of low viscosity (about 20 centipoises, for example) from a standpoint of obtaining the cavity favorably.

Other than the spin coating method, the adhesive layer 5 may be formed by a screen printing method that uses a printing mask, by a dispense method that uses a dispenser to apply the adhesive material or by other method.

Figure 4:
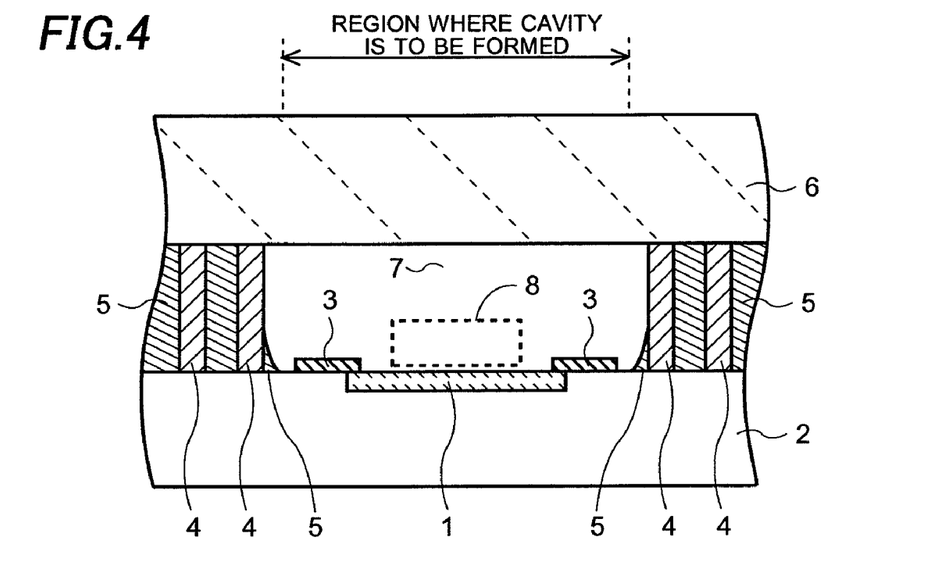
FIG. 4 is a cross-sectional view showing the semiconductor device and its manufacturing method according to the first embodiment of this invention.

Next, a supporting member 6 is bonded through the columnar structures 4 and the adhesive layer 5, as shown in FIG. 4. The supporting member 6 may be a substrate made of glass, quartz, ceramics, metal or the like, or may be made of resin (epoxy resin, acryl resin or polyester resin, for example). Its thickness is 300 μm, for example. By bonding the supporting member 6, there is formed the cavity 7 surrounded with the semiconductor substrate 2, the columnar structures 4 and the supporting member 6.

It is preferable that the supporting member 6 is bonded to the semiconductor substrate 2 under a reduced pressure to leave the cavity 7 in a vacuum state. Or, they may be bonded to each other in an atmosphere of inert gas (nitrogen, for example) to fill the cavity 7 with the inert gas. That is because corrosion and deterioration of the sealed-in device component 1 due to oxidation can be prevented by keeping the cavity 7 in the vacuum state or in the state filled with the inert gas.

It is possible that an additional device component 8 is disposed on the semiconductor substrate 2 after the columnar structures 4 are formed and before the supporting member 6 is bonded. The device component 8 is a mechanical device such as a MEMS (Micro Electro Mechanical Systems) component, for example. Other than the device component, a fine-structure component such as a filter material or a lens may be disposed on the semiconductor substrate in the cavity 7. By adding a process step to seal the additional device component or the fine-structure component in the cavity 7 before bonding the supporting member, the semiconductor device is to be completed with increased variety.

Next, back grinding using a back surface grinding apparatus (a grinder) is applied to a back surface of the semiconductor substrate 2 to reduce the thickness of the semiconductor substrate 2 to a predetermined thickness (100 μm, for example). The back grinding may be replaced with etching, or with a combination of grinding and etching. The back grinding is not required in some cases, depending on usage or specifications of the finished product or an initial thickness of the semiconductor substrate 2 provided at the beginning.

Figure 5:
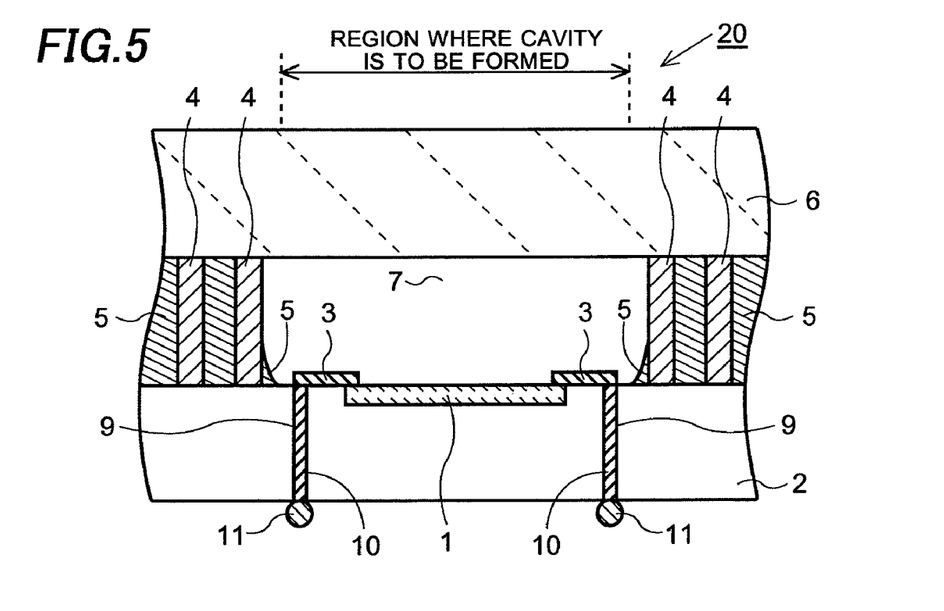
FIG. 5 is a cross-sectional view showing the semiconductor device and its manufacturing method according to the first embodiment of this invention.

Next, the semiconductor substrate 2 is selectively etched from the back surface to the top surface to form a plurality of via holes 9 that reach the wiring layer 3, as shown in FIG. 5.

Next, an insulation film (not shown) and a barrier layer (a titanium layer or a titanium nitride layer, for example) are formed in the via holes 9 one after another, and through-hole electrodes 10 (made of copper, aluminum, aluminum alloy or the like, for example) that are electrically connected with the wiring layer 3 are formed in addition. Next, a protection layer (made of solder resist, for example, not shown), that has openings in regions where conductive terminals 11 are to be formed, is formed on the back surface of the semiconductor substrate 2.

Next, the conductive terminals 11 (made of solder, gold or nickel, for example) electrically connected with the through-hole electrodes 10 are formed in the openings in the protection layer (not shown). The conductive terminals 11 can be formed by a screen printing method, a plating method or a dispense method, for example. Although the conductive terminal 11 is formed immediately below the through-hole electrode 10 in FIG. 5, a back surface wiring may be formed and the conductive terminal 11 may be formed on the back surface wiring.

Next, dicing is performed along dicing lines DL to complete individual semiconductor devices 20. Methods to separate into the individual semiconductor devices 20 include a dicing method, an etching method, a laser cutting method and the like. The completed semiconductor device 20 is mounted on a circuit board or the like on which external electrodes are formed in a pattern.

In the semiconductor device according to the embodiment, as described above, the plurality of columnar structures is formed to surround the region on the semiconductor substrate where the cavity is to be formed. And with such composition, the adhesive layer tends to gather around the columnar structures when it is formed on the semiconductor substrate. In contrast, the adhesive layer does not deposit in the region where the cavity is to be formed, and the cavity can be formed easily as a result. Also, controlling the location to apply the adhesive layer 5 is not necessary and the manufacturing process can be simplified, since the material can be gathered in the region excluding the region where the cavity is to be formed only by applying the adhesive material on the entire top surface of the semiconductor substrate. Also, deterioration in the operational quality due to the adhesive layer can be suppressed by suppressing formation of the adhesive layer in the region where the cavity is to be formed.

Also, since there is formed the plurality of columnar structures, the strength against external mechanical damage is improved as the adhesion between the semiconductor substrate and the supporting member is improved.

Next, a semiconductor device and its manufacturing method according to a second embodiment of this invention will be explained referring to the drawings. The same components as those shown in the first embodiment are denoted by the same symbols, and explanations on them are omitted. FIG. 7 is a plan view of the semiconductor device 25 according to the second embodiment, and FIG. 6 is a cross-sectional view showing a section Y-Y in FIG. 7.

Figure 6:
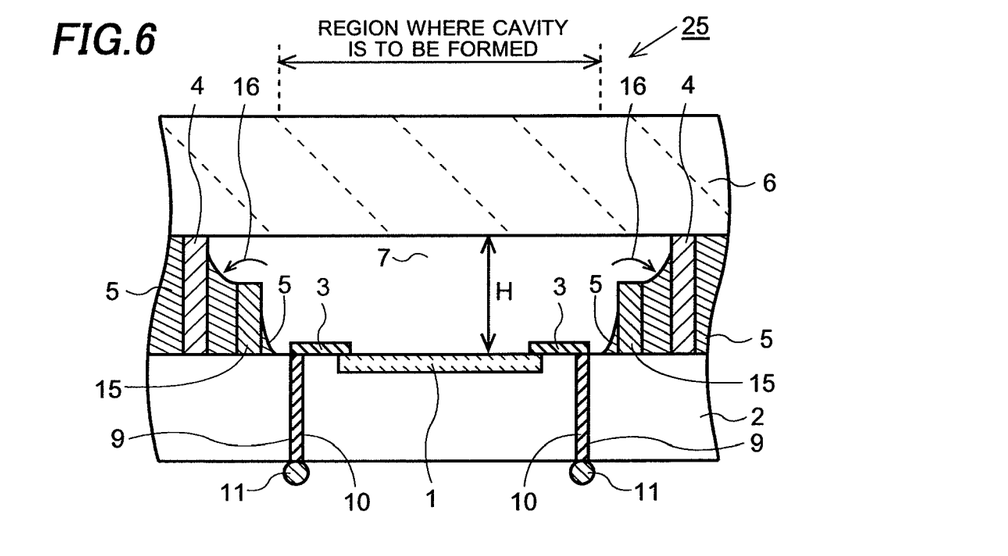
FIG. 6 is a cross-sectional view showing a semiconductor device and its manufacturing method according to a second embodiment of this invention.
Figure 7:
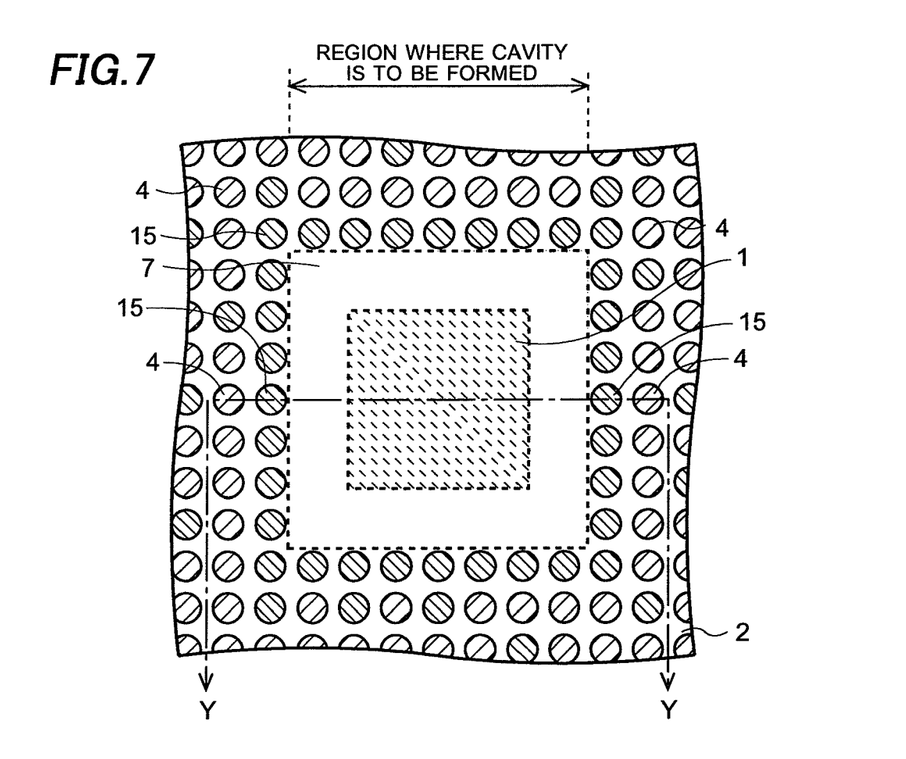
FIG. 7 is a plan view showing the semiconductor device and its manufacturing method according to the second embodiment of this invention.

A feature of the semiconductor device 25 is that a height of some columnar structures out of the plurality of columnar structures is smaller than a distance H between the semiconductor substrate and the supporting member, as shown in FIG. 6 and FIG. 7. They are called columnar structures 15. Similar to the columnar structures 4 described above, the columnar structures 15 can be formed by applying a resist layer followed by exposure and development, for example.

A composition with varied heights of the columnar structures as described above gives a following effect in addition to the effects described in the first embodiment. That is, the material of the adhesive layer 5 also comes in over the columnar structures 15, as indicated by arrows 16 shown in FIG. 6. Therefore, an effect to gather the adhesive layer 5 around the columnar structures is enhanced to form the cavity 7 more efficiently than in the first embodiment.

Next, a semiconductor device and its manufacturing method according to a third embodiment of this invention will be explained referring to the drawings. The same components as those shown in the preceding drawings are denoted by the same symbols, and explanations on them are omitted. FIG. 9 is a plan view of the semiconductor device 30 according to the third embodiment and FIG. 8 is a cross-sectional view showing a section Z-Z in FIG. 9.

Figure 8:
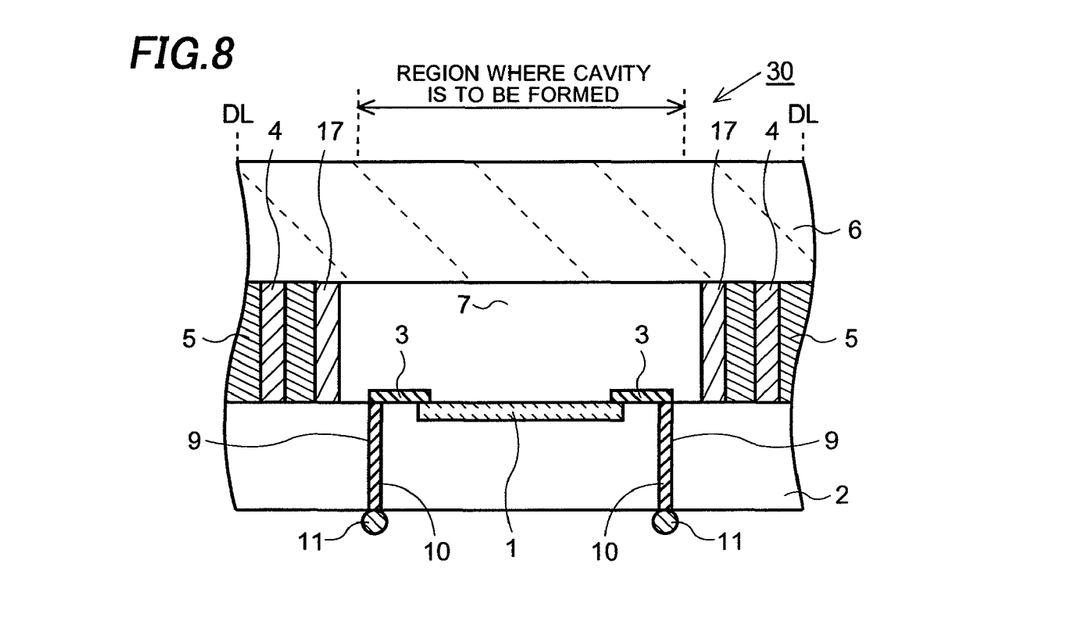
FIG. 8 is a cross-sectional view showing a semiconductor device and its manufacturing method according to a third embodiment of this invention.
Figure 9:
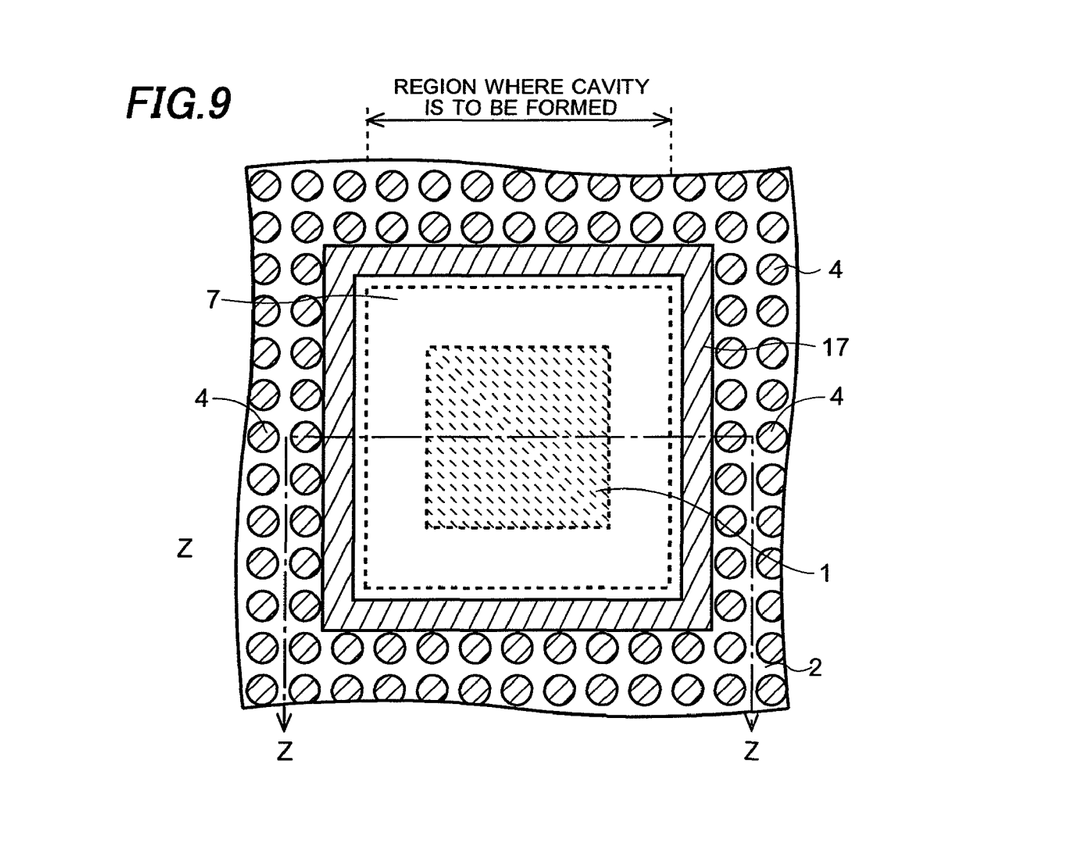
FIG. 9 is a plan view showing the semiconductor device and its manufacturing method according to the third embodiment of this invention.

A feature of the semiconductor device 30 is that a ring-shaped structure 17, which surrounds the region where the cavity is to be formed, is formed in addition to the columnar structures 4, as shown in FIG. 8 and FIG. 9. The ring-shaped structure 17 can be formed by the same process as the process to form the columnar structures 4. To describe concretely, the entire top surface of the semiconductor substrate 2 is coated with a resist layer, and an exposure to transfer a pattern of the ring-shaped structure 17 to the resist layer is performed. By subsequent development and selective removal of the resist layer, the resist layer is formed into a shape of the ring-shaped structure 17. It is necessary to control the applying locations in the process to apply the material of the adhesive layer 5 to that the material of the adhesive layer 5 does not enter inside the ring-shaped structure 17.

With the composition provided with the ring-shaped structure 17 as described above, the ring-shaped structure 17 serves as a wall to prevent the adhesive layer 5 from entering into its inside. As a result, the cavity 7 can be securely formed by controlling the applying locations of the adhesive layer 5.

Needless to say, this invention is not limited to the embodiments described above and may be modified within the scope of the invention. Therefore, it is possible to change the material and the manufacturing process of the columnar structures 4 and 15 and the ring-shaped structure 17, for example. Although BGA (Ball Grid Array) type semiconductor devices are explained in the explanations described above, this invention may be applied to LGA (Land Grid Array) type semiconductor devices, other CSP type semiconductor devices and flip chip type semiconductor devices.

The invention claimed is:

1. A semiconductor device comprising:
   a semiconductor substrate;
   a plurality of non-conductive columnar structures formed on the semiconductor substrate;
   a supporting member bonded to the semiconductor substrate;
   solid adhesive layer filling a space between the columnar structures and bonding the supporting member to the semiconductor substrate; and
   a device component sealed in a cavity formed by the semiconductor substrate, the columnar structures, the adhesive layer and the supporting member.

2. The semiconductor device of claim 1, wherein a height of at least one of the plurality of columnar structures is smaller than a distance between the semiconductor substrate and the supporting member.

3. The semiconductor device of claim 1 further comprising an enclosure structure formed on the semiconductor substrate so as to surround the device component.

4. The semiconductor device of claim 3, wherein each of the columnar structures and the enclosure structure comprises an organic film.

5. The semiconductor device of claim 1, wherein the columnar structures are formed at a substantially uniform density.

6. The semiconductor device of claim 1, wherein a density of the columnar structures formed at a location distant from the device component is smaller than a density of the columnar structures formed at a location close to the device component.

7. The semiconductor device of claim 1, wherein the columnar structures are placed from each other at a distance that induces a capillary phenomenon of a fluid.

* * * * *